United States Patent
He

(10) Patent No.: US 10,158,051 B2
(45) Date of Patent: Dec. 18, 2018

(54) PROCESS METHOD FOR REFINING PHOTOCONVERTER TO BOND-PACKAGE LED AND REFINEMENT EQUIPMENT SYSTEM

(71) Applicant: Jiangsu Cherrity Optronics Co., Ltd., Jiangning Nanjing (CN)

(72) Inventor: Jinhua He, Jiangning Nanjing (CN)

(73) Assignee: JIANGSU CHERITY OPTRONICS CO., LTD., Jiangsu (CN)

( * ) Notice: Subject to any disclaimer, the term of this patent is extended or adjusted under 35 U.S.C. 154(b) by 0 days.

(21) Appl. No.: 15/737,919

(22) PCT Filed: Dec. 18, 2015

(86) PCT No.: PCT/CN2015/097918
§ 371 (c)(1),
(2) Date: Dec. 19, 2017

(87) PCT Pub. No.: WO2017/028430
PCT Pub. Date: Feb. 23, 2017

(65) Prior Publication Data
US 2018/0198032 A1    Jul. 12, 2018

(30) Foreign Application Priority Data

Aug. 18, 2015 (CN) .......................... 2015 1 0507431
Aug. 18, 2015 (CN) .......................... 2015 1 0508209
Sep. 30, 2015 (CN) .......................... 2015 1 0640249

(51) Int. Cl.
*H01L 33/50*    (2010.01)
*H01L 33/48*    (2010.01)
(Continued)

(52) U.S. Cl.
CPC .............. *H01L 33/50* (2013.01); *B29C 59/04* (2013.01); *H01L 33/005* (2013.01); *H01L 33/48* (2013.01);
(Continued)

(58) Field of Classification Search
None
See application file for complete search history.

(56) References Cited

U.S. PATENT DOCUMENTS

2007/0057364 A1* 3/2007 Wang .................. C03C 8/02
257/701
2014/0085829 A1* 3/2014 Yamashita ........ H01L 23/49827
361/717
(Continued)

FOREIGN PATENT DOCUMENTS

CN        1244010 A     2/2000
CN       101872828 A    10/2010
(Continued)

OTHER PUBLICATIONS

International Search Report and Written Opinion for PCT/CN2015/097918 dated Apr. 13, 2016, 9 pp.

*Primary Examiner* — Bradley K Smith
(74) *Attorney, Agent, or Firm* — Edwin S. Flores; Chalker Flores, LLP

(57) ABSTRACT

Provided are a process method for bond-packaging an LED using a refined photoconverter, and a refining equipment system. The process method includes the following continuous process flow: roll-shaping of a special-shaped microporous carrier sheet, refining of a semi-cured photoconversion sheet, preparation of a flip chip LED array sheet, forming of LED package elements by roll-bonding, curing of the LED package elements, and cutting of the LED package elements. The present invention has a significant advantage of a refined photoconverter, and especially can meet a require- (Continued)

ment of a continuous process flow of bond-packaging an LED using an organic silicone resin photoconverter, so as to enhance the production efficiency and yield of LED packages in industrialized batch production.

19 Claims, 9 Drawing Sheets

(51) Int. Cl.
*B29C 59/04* (2006.01)
*H01L 33/00* (2010.01)
*H01L 33/52* (2010.01)
*H01L 33/44* (2010.01)

(52) U.S. Cl.
CPC .............. *H01L 33/52* (2013.01); *H01L 33/44* (2013.01); *H01L 2933/0041* (2013.01)

(56) References Cited

U.S. PATENT DOCUMENTS

| | | | |
|---|---|---|---|
| 2014/0252679 A1 | 9/2014 | Hwang et al. | |
| 2016/0133809 A1* | 5/2016 | Kuramoto | H01L 33/0095 438/27 |

FOREIGN PATENT DOCUMENTS

| | | |
|---|---|---|
| CN | 102881780 A | 1/2013 |
| CN | 103531691 A | 1/2014 |
| CN | 104321888 A | 1/2015 |
| DE | 102012207777 A1 | 11/2013 |
| WO | 2017028430 A1 | 2/2017 |

* cited by examiner

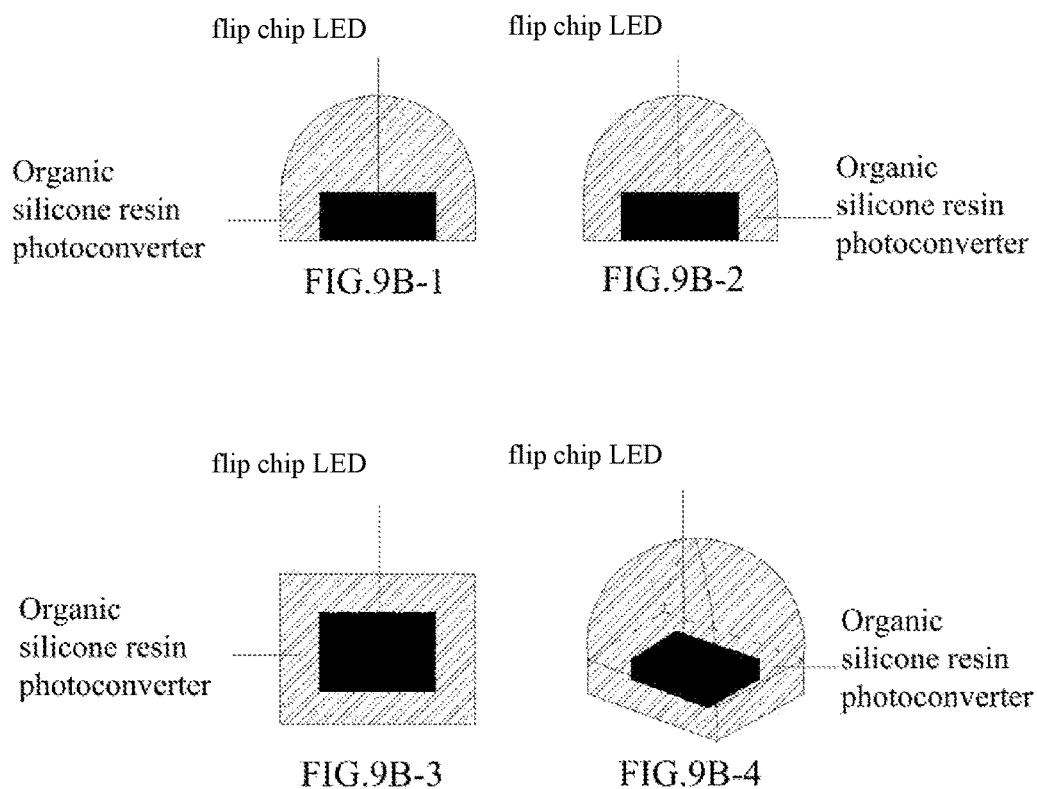

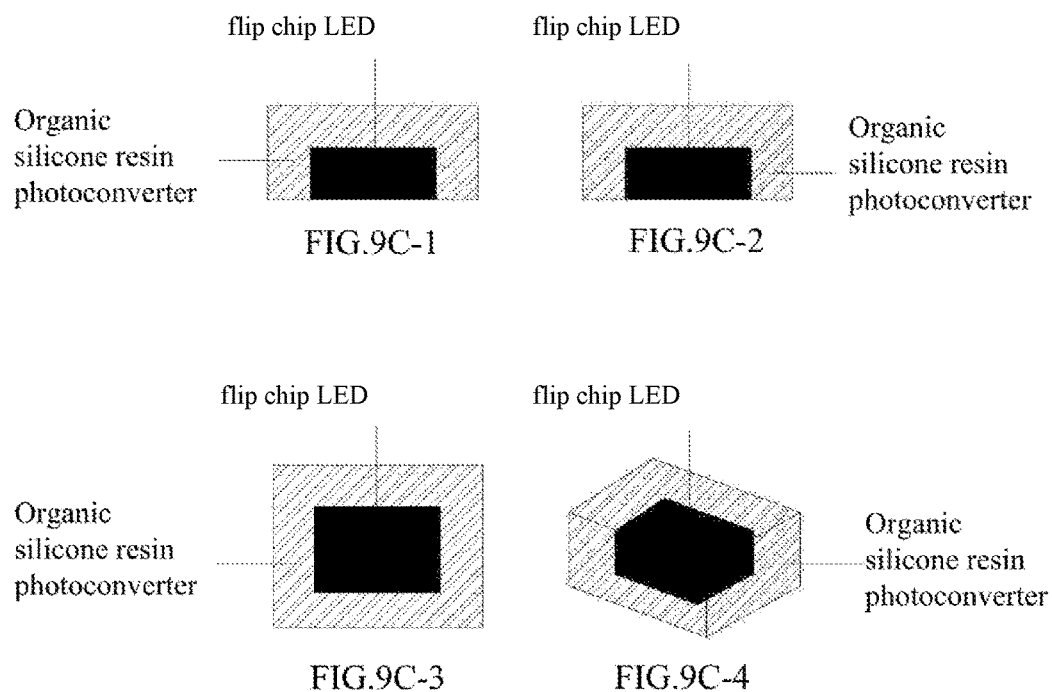

PROCESS METHOD FOR REFINING PHOTOCONVERTER TO BOND-PACKAGE LED AND REFINEMENT EQUIPMENT SYSTEM

CROSS-REFERENCE TO RELATED APPLICATIONS

This application is the National Stage of International Application No. PCT/CN2015/097918, filed on Dec. 18, 2015 claiming the priority of CN 201510507431.1, filed on Aug. 18, 2015, CN 201510508209.3, filed on Aug. 18, 2015 and CN 201510640249.3, filed on Sep. 30, 2015, the content of each of which is incorporated by reference herein.

TECHNICAL FIELD

The present invention relates to the technical field of LED packaging using a photoconverter, and in particular, to a process method for bond-packaging an LED using a refined organic silicone resin photoconverter, and a refining equipment system.

BACKGROUND

With the advantages such as high brightness, low heat, long service life, and being environmentally friendly and renewable, LEDs are known as the most promising new generation of green light sources in the 21st century. At present, the theoretical service life of the LED can be over 100,000 hours. However, during actual application, limited by many factors such as chip failure, package failure, thermal overstress failure, electrical overstress failure, and/or assembly failure, especially limited by the package failure, the LED prematurely encounters luminous decay or loss of luminous efficacy, thus hindering development of the LED to be a novel energy-saving light source. To solve these problems, many scholars in the field have carried out related researches, and have proposed some improvement measures to enhance luminous efficacy and actual service life of the LED. For example, flip-chip LED packaging is developed in recent years. Compared with conventional LED upright packaging, this flip-chip manner has such advantages as high luminous efficacy, high reliability, and easy integration. This manner also greatly saves packaging materials. For example, materials such as a gold wire, die bonding glue, and a support that are used in the conventional LED upright packaging are no longer needed. Further, this manner greatly simplifies a packaging process. For example, die bonding, wire soldering, and even light splitting in the conventional LED upright packaging are no longer needed. In this way, the flip-chip LED packaging is increasingly widely applied. However, it should also be noted that, the existing flip-chip LED packaging technologies mostly bond a photoconverter made of an organic silicone resin to a flip chip LED by using a casting process, a screen printing process, an upper and lower flat plate molding process, a single roller pressing process, and the like. These processes and matched packaging equipment cannot desirably solve flaws such as pores and unequal thickness of the photoconverter made of the organic silicone resin, thus causing a low yield of the LEDs packaged by using a photoconverter. In addition, due to low production efficiency, the high product costs cannot be reduced.

Chinese patent application NO. 201010204860.9 discloses a "flip-chip LED packaging method", which includes steps of: (a) coating a surface of an LED chip with a photoconverter through screen printing, and baking the photoconverter to cure the photoconverter; (b) fixing the LED chip on a chip substrate, such that electrodes of the LED chip and electrodes of the chip substrate are bonded; (c) fixing the LED chip and the chip substrate to the bottom of a reflector cup on a support; (d) separately connecting positive and negative electrodes of the fixed chip substrate to positive and negative electrodes of the support by using wires; (e) placing a sealing mold or lens cover on the support on which the LED chip and the chip substrate are fixed, and filling the sealing mold or lens cover with silica gel; and (f) baking a whole structure to cure it. This method uses the screen printing process to enhance uniformity of coating thickness of the photoconverter and enhance distribution uniformity of fluorescent powder particles, so as to improve the yield. However, there exist the following obvious defects: First, after the surface of the LED chip is coated with the photoconverter made of the organic silicone resin through a screen printing process, due to thermal overstress in a subsequent baking and curing procedure, pores still occur in part of the photoconverter coating and the coated surface of the LED chip, thus forming sags and crests. Secondly, after the sealing mode or lens cover is filled with the silica gel and packaged together with the photoconverter-coated LED chip, due to thermal overstress in the subsequent procedure of baking and curing the whole structure, pores still occur in part of the silica gel layer on the sealing mold or lens cover, thus forming sags and crests. Because the thermal overstress impact on the LED chip cannot be resolved in the packaging procedure, LED luminous efficacy is reduced inevitably. Thirdly, an intelligent control system is not equipped to control the whole LED chip packaging process, which directly affects improvement of the yield.

Chinese patent application NO. 201310270747.4 discloses an "LED coated with photoconverter layer, manufacturing method for same, and LED device". This solution includes: an LED configuration stage, in which an LED is configured on a surface of a support chip in a through-thickness direction; a layer configuration stage, in which a photoconverter layer is configured on a surface of the support chip in the through-thickness direction in the same manner as LED configuration, the photoconverter layer being formed by active energy ray cured resin which is cured by irradiation with an active energy ray and a fluorescent resin composition of the photoconverter; a curing stage, in which the photoconverter layer is irradiated with an active energy ray to cure the photoconverter layer; a cutting stage, in which the photoconverter layer is cut corresponding to the LED, to obtain an LED coated with the photoconverter layer; and an LED separation stage, in which the LED coated with the photoconverter layer is separated from the support chip after the cutting process. This method aims to offer a solution to uniform configuration of photoconverters around the LED to avoid damage, thus obtaining an LED coated with a photoconverter layer, and an LED device having the LED coated with the photoconverter layer. However, there exist the following obvious defects: First, in a curing procedure of the fluorescent resin composition of the photoconverter, due to thermal overstress, pores still occur in part of the photoconverter surface layer, thus forming sags and crests. Secondly, the LED coated with the photoconverter layer is still affected by the thermal overstress, causing a decrease in luminous efficacy of the LED in use. Thirdly, the stages of the whole packaging process are complicated, causing low production efficiency of LED packages. Fourthly, an upper and lower flat plate molding process may cause displacement of a flip chip, thus inevitably reducing the yield.

Chinese patent application NO. 201380027218.X discloses a "resin sheet laminate, and manufacturing method for semiconductor light-emitting element using same". In this solution, the resin sheet laminate is formed by disposing a fluorophor-containing resin layer on a substrate, where the fluorophor-containing resin layer has multiple regions, the substrate has a lengthwise direction and a transverse direction, and the multiple regions are arranged along the lengthwise direction repeatedly to form columns. By using the resin sheet laminate, this solution aims to enhance uniformity of color and brightness of a semiconductor light-emitting element to which the fluorophor-containing resin layer is attached, and make it easy to manufacture and free to design the element. However, there exist the following obvious defects: First, the used fluorescent resin sheet is a cured fluorescent resin sheet, and therefore, possible residual pores, sags and crests, or other flaws produced during processing cannot be effectively eliminated. Secondly, in a bonding stage, a pressure is exerted by a pressurizing tool from a side of the semiconductor light-emitting element, which may damage the semiconductor light-emitting element. Thirdly, in the bonding stage using an adhesive in the fluorophor-containing resin layer, it is difficult to eliminate residuals from the semiconductor light-emitting element after bonding, and pores easily occur in the bonding procedure, thus reducing the yield; in addition, existence of the bonding layer reduces light emission efficiency of the LED element. Fourthly, the substrate under the fluorescent resin sheet bonded to the light emitting surface of the semiconductor light-emitting element is not removed, which directly affects luminous efficacy of the semiconductor light-emitting element. Fifthly, the multiple regions of the fluorophor-containing resin layer are arranged in the lengthwise direction repeatedly to form columns, but actually it is complex to arrange the multiple regions of the fluorophor-containing resin layer in such a manner, thus affecting the packaging efficiency of the whole element. An error in arrangement positions of the multiple regions directly affects the precision of subsequent bonding with the light-emitting element. If the multiple regions cannot be rendered uniform in size and thickness, a severe problem of product inconsistency may emerge.

To sum up, how to overcome the defects in the prior art has become one of major difficulties to be solved urgently in the technical field of LED packaging using a photoconverter at present.

SUMMARY OF THE INVENTION

An objective of the present invention is to overcome the defects in the prior art, and provide a process method for bond-packaging an LED using a refined photoconverter and a refining equipment system. The present invention has a significant advantage of a refined photoconverter, and especially can meet a requirement of a continuous process flow of bond-packaging an LED using an organic silicone resin photoconverter, so as to enhance the production efficiency and yield of LED packages in industrialized batch production.

A process method for bond-packaging an LED using a refined photoconverter provided by the present invention includes the following continuous process flow: roll-shaping of a special-shaped microporous carrier sheet, refining of a semi-cured photoconversion sheet, preparation of a flip chip LED array sheet, forming of LED package elements by roll-bonding, curing of the LED package elements, and cutting of the LED package elements. The method includes the following basic steps:

step 1: roll-shaping of a special-shaped microporous carrier sheet: performing roll-shaping on a microporous carrier sheet by using a first rolling device with a protrusion array and a second rolling device with a recess array that are disposed face-to-face and aligned with each other, to obtain a special-shaped microporous carrier sheet with a recess array, a micropore diameter of the microporous carrier sheet being not greater than 10 μm;

step 2: refining of a semi-cured photoconversion sheet: conveying the special-shaped microporous carrier sheet in step 1 to a planar conveyor A with a recess array to continuously convey the sheet forward, and allocating mixed slurry containing a photoconversion material and organic silicone resin to the special-shaped microporous carrier sheet by using a doser, to form a mixed slurry layer with a fixed thickness; then continuously conveying the sheet forward to enter a refining device for negative pressure suction and light irradiation, to obtain a refined semi-cured photoconversion sheet, where the refining device includes a light irradiator B and a negative pressure suction device C that are disposed face-to-face and aligned with each other, the light irradiator B is disposed above the planar conveyor A, the negative pressure suction device C is disposed below the planar conveyor A, and a suction produced by the negative pressure suction device C acts, together with light irradiation energy, on the special-shaped microporous carrier sheet loaded with the mixed slurry; or the refining device includes a light irradiator B and a negative pressure-suction and magnetic vibration device D that are disposed face-to-face and aligned with each other; the light irradiator B is disposed above the planar conveyor A; the negative pressure-suction and magnetic vibration device D is disposed below the planar conveyor A; and a suction and a magnetic vibration force that are produced by the negative pressure-suction and magnetic vibration device D, together with the light irradiation energy, act upon the special-shaped microporous carrier sheet loaded with the mixed slurry; and the shape and dimensions of each recess in the recess array in the planar conveyor A are the same as those of each recess in the second rolling device with a recess array, that is, recesses on the special-shaped microporous carrier sheet and recesses on the planar conveyor A face each other and closely fit each other;

step 3: preparation of a flip chip LED array sheet: acquiring a flip chip LED array sheet, where flip chip LEDs in the flip chip LED array sheet are arranged in an array on a carrier sheet, the flip chip LED referring to an individual flip chip LED or a flip chip LED assembly, and the flip chip LED assembly being composed of two or more flip chip LEDs;

step 4: forming of LED package elements by roll-bonding: in a vacuum heating condition, conveying the semi-cured photoconversion sheet in step 2 to a fourth rolling device with a recess array, and then performing roll-bonding on the semi-cured photoconversion sheet and the flip chip LEDs in the flip chip LED array sheet arranged on a third rolling device, the semi-cured photoconversion sheet and the flip chip LED array sheet facing each other and being aligned with each other, to obtain LED package elements, where the shape and dimensions of each recess in the recess array in the fourth rolling device are the same as those of each recess in the recess array in the second rolling device;

step 5: curing of the LED package elements: in a vacuum condition, by means of heat curing and/or photocuring, curing the LED package elements in step 4 by using a curing apparatus E, to obtain cured LED package elements; and step 6: cutting of the LED package elements: removing the special-shaped microporous carrier sheet from the cured LED package elements in step 5, and cutting the cured LED package elements, to form finished LED package elements having slits for splitting the finished product into individual LED package elements.

To better solve the problems in the existing flip chip LED packaging process, the present invention subtly designs a novel process method of bond-packaging an LED using a refined photoconverter. A refining and packaging principle of the present invention is as follows: First, a roller is used to perform roll-shaping on a microporous carrier sheet, and mixed slurry containing a photoconversion material and organic silicone resin is allocated to the shaped microporous carrier sheet, to obtain a semi-cured organic silicone resin photoconversion sheet having a light-emitting surface layer with a required shape, such as a cambered surface, a hemispheric surface, or a planar surface. Secondly, in the refining of the secured photoconversion sheet, a suction and a magnetic vibration force that are produced by a refining device, together with light irradiation energy, act upon the special-shaped microporous carrier sheet loaded with the mixed slurry, so as to effectively eliminate possible residual pores, sags and crests, or other flaws produced during processing in the semi-cured organic silicone resin photoconversion sheet, thus obtaining a flat refined semi-cured organic silicone resin photoconversion sheet without pores and having a uniform thickness. Thirdly, by using a rolling principle, the present invention organically integrates three procedures of shaping of the special-shaped microporous carrier sheet, refining of a photoconversion sheet, and forming of LED package elements by roll-bonding, such that a process of adding an extra bonding layer in the prior art is omitted, and high-quality bonding and packaging of the photoconversion sheet and the flip chip LEDs can be ensured. Fourthly, the present invention provides a continuous process flow, which can meet processing conditions of batch production of LED package elements and achieve completely consistent specifications and dimensions. In this way, the production efficiency of the LED package elements is enhanced, brightness and color uniformity of finished LED package elements is improved, and the yield is greatly improved.

The present invention has the following remarkable advantages in comparison with the prior art:

First, the new process method of bond-packaging an LED using a refined photoconverter provided by the present invention is a novel process flow of LED bond-packaging by continuous rolling, which solves the problems of low light emission efficiency, low production efficiency, and a low yield of the LED bond-packaged by using existing conventional processes such as a casting process, a screen printing process, an upper and lower flat plate molding process, a single roller pressing process, and the like. The present invention can meet a requirement of bond-packaging the LED by using a semi-cured organic silicone resin photoconverter, and enhance the production efficiency and yield of LED packages in industrialized batch production.

Secondly, the semi-cured photoconversion sheet having a special-shaped light-emitting surface layer appearing a shape of a cambered surface, a hemispheric surface, or a planar surface is fabricated on the shaped microporous carrier sheet, and then the semi-cured photoconversion sheet is refined. In this way, possible residual pores, sags and crests, or other flaws produced during processing in the photoconversion sheet can be effectively eliminated, thus significantly improving brightness and color uniformity, and light emission uniformity and efficiency of finished LED package elements.

Thirdly, by using a rolling principle, the present invention organically integrates three procedures of shaping of the special-shaped microporous carrier sheet, refining of a photoconversion sheet, and forming of LED package elements by roll-bonding, such that a process of adding an extra bonding layer in the prior art is omitted, and the quality of bond-packaging of the special-shaped photoconversion sheet and the flip chip LEDs is improved. Moreover, it is convenient to equip an equipment system for a continuous process and to carry out intelligent control, so as to meet a production requirement of LED packages in industrialized batch production. In this way, the production efficiency of industrialized LED packaging in batches is remarkably improved.

Fourthly, the new process method and refining equipment system that are provided by the present invention are widely applicable to a packaging process of bonding an organic silicone resin photoconverter to flip chip LEDs of different power, thus completely meeting a requirement of refining the product production process during industrialized LED packaging in batches.

BRIEF DESCRIPTION OF THE DRAWINGS

FIG. 9A-1 is a left view, FIG. 9A-2 is a right view, FIG. 9A-3 is a bottom view, and FIG. 9A-4 is a three-dimensional view;

FIG. 9B shows a hemispheric surface-shaped LED package element manufactured according to the present invention, where FIG. 9B-1 is a left view, FIG. 9B-2 is a right view, FIG. 9B-3 is a bottom view, and FIG. 9B-4 is a three-dimensional view; and FIG. 9C shows a planar surface-shaped LED package element manufactured according to the present invention, where FIG. 9C-1 is a left view, FIG. 9C-2 is a right view, FIG. 9C-3 is a bottom view, and FIG. 9C-4 is a three-dimensional view.

Meaning of numerals in the accompanying drawings of the present invention:
- 1-1 First single-wheeled roller with a protrusion array
- 1-2 Second planar conveyor with a recess array
- 1-3 Second single-wheeled roller with a recess array
- 1-4 Protrusion on the first single-wheeled roller
- 1-5 Recess on the second planar conveyor
- 1-6 Recess on the second single-wheeled roller
- 2-1 Doser
- 2-2 Planar conveyor A with a recess array
- 2-3 Scraper on the doser
- 2-4 Discharge port
- 2-5 Recess on the planar conveyor A
- 3-1 Light irradiator
- 3-2 Negative pressure suction device
- 3-3 Negative pressure-suction and magnetic vibration device D
- 4-1 Third single-wheeled roller with a smooth surface
- 4-2 Fourth single-wheeled roller with a recess array
- 4-3 flip chip LED
- 4-4 Carrier sheet
- 4-5 Recess on the fourth single-wheeled roller
- 5 Curing apparatus E
- 6 Removing and cutting apparatus
- 7 Wind-up roller
- 8-1 Carrier sheet
- 8-2 Mixed slurry layer with a fixed thickness
- 8-3 Semi-cured photoconversion sheet
- 8-4 LED package element
- 9-1 Buffer roller
- 9-2 flip chip LED buffer roller

DETAILED DESCRIPTION

Specific implementations of the present invention are described in detail below with reference to the accompanying drawings and embodiments.

Embodiment 1

Figure 1:
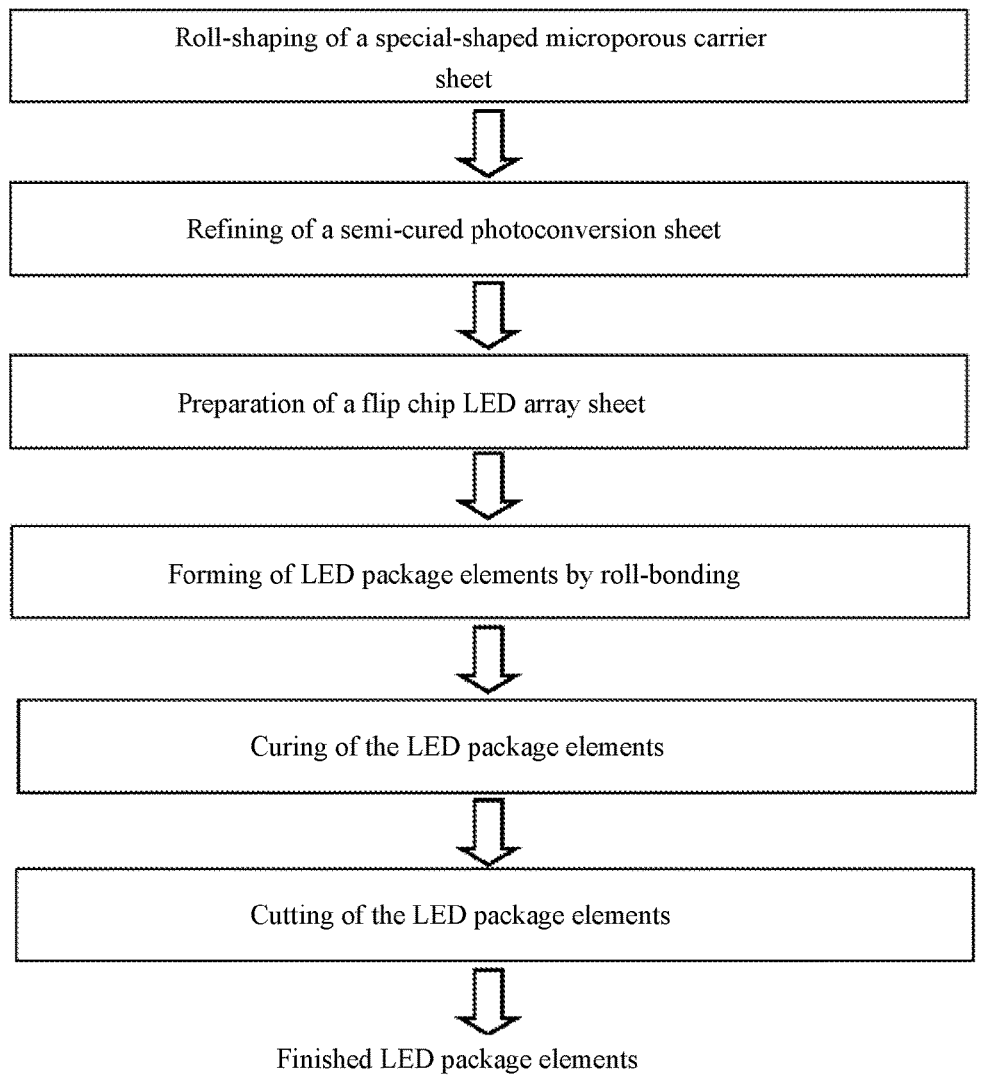
FIG. 1 is a schematic block diagram of procedures of a process method for bond-packaging an LED using a refined photoconverter according to the present invention.
Figure 2:
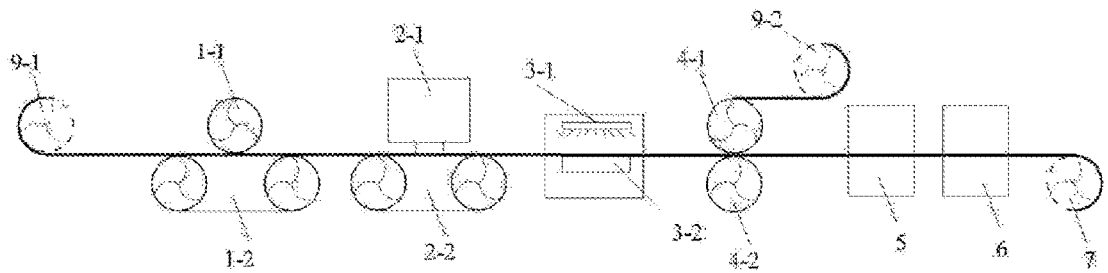
FIG. 2 is a schematic structural diagram of a first flow layout in the process method for bond-packaging an LED using a refined photoconverter according to the present invention.
Figure 4:
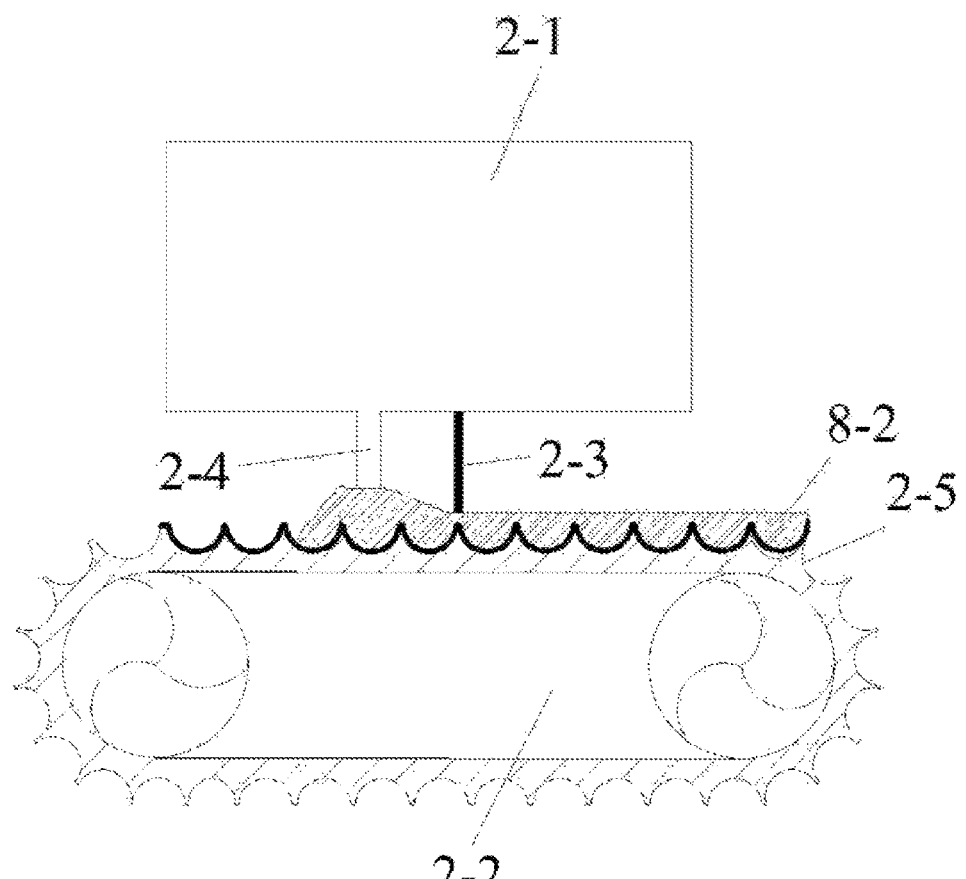
FIG. 4 is a schematic diagram of a stage of forming a mixed slurry layer on the special-shaped microporous carrier sheet shown in FIG. 2 of the present invention.
Figure 6:
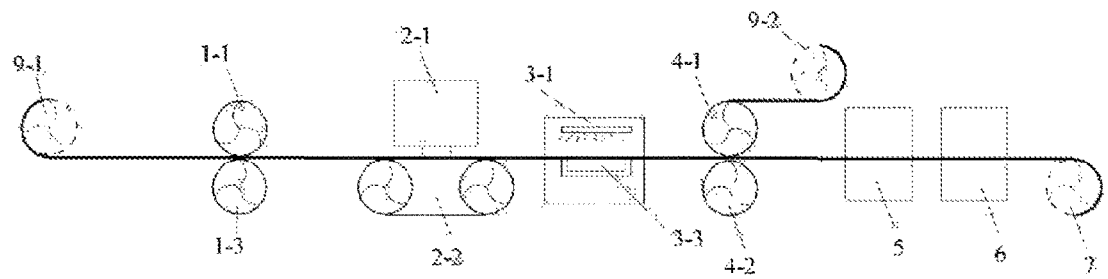
FIG. 6 is a schematic structural diagram of a second flow layout in the process method for bond-packaging an LED using a refined photoconverter according to the present invention.

Referring to FIGS. 1, 2 and 6, a process method for bond-packaging an LED using a refined photoconverter provided by the present invention includes the following continuous process flow: roll-shaping of a special-shaped microporous carrier sheet, refining of a semi-cured photoconversion sheet, preparation of a flip chip LED array sheet, forming of LED package elements by roll-bonding, curing of the LED package elements, and cutting of the LED package elements. The method specifically includes the following basic steps:

step 1: roll-shaping of a special-shaped microporous carrier sheet: performing roll-shaping on a microporous carrier sheet by using a first rolling device with a protrusion array and a second rolling device with a recess array that are disposed face-to-face and aligned with each other, to obtain a special-shaped microporous carrier sheet with a recess array, a micropore diameter of the microporous carrier sheet being not greater than 10 μm;

step 2: refining of a semi-cured photoconversion sheet: conveying the special-shaped microporous carrier sheet in step 1 to a planar conveyor A with a recess array to continuously convey the sheet forward, and allocating mixed slurry containing a photoconversion material and organic silicone resin to the special-shaped microporous carrier sheet by using a doser, to form a mixed slurry layer with a fixed thickness, as shown in FIG. 4; then continuously conveying the sheet forward to enter a refining device for negative pressure suction and light irradiation, to obtain a refined semi-cured photoconversion sheet, where the refining device includes a light irradiator B and a negative pressure suction device C that are disposed face-to-face and aligned with each other, the light irradiator B is disposed above the planar conveyor A, the negative pressure suction device C is disposed below the planar conveyor A, and a suction produced by the negative pressure suction device C, together with light irradiation energy, acts upon the special-shaped microporous carrier sheet loaded with the mixed slurry, a negative pressure value of the negative pressure suction device C being greater than or equal to 100 Pa; and the shape and dimensions of each recess in the recess array in the planar conveyor A are the same as those of each recess in the second rolling device 2 with a recess array, that is, recesses on the special-shaped microporous carrier sheet and recesses on the planar conveyor A are bonded in a matching manner;

step 3: preparation of a flip chip LED array sheet: acquiring a flip chip LED array sheet, where flip chip LEDs in the flip chip LED array sheet are arranged in an array on a carrier sheet, the flip chip LED referring to an individual flip chip LED or a flip chip LED assembly, and the flip chip LED assembly being composed of two or more flip chip LEDs;

step 4: forming of LED package elements by roll-bonding: in a vacuum heating condition, conveying the semi-cured photoconversion sheet in step 2 to a fourth rolling device with a recess array, and then performing roll-bonding on the semi-cured photoconversion sheet and the flip chip LEDs in the flip chip LED array sheet arranged on a third rolling device, the semi-cured photoconversion sheet and the flip chip LED array sheet facing each other and being aligned with each other, to obtain LED package elements, where the shape and dimensions of each recess in the recess array in the fourth rolling device are the same as those of each recess in the recess array in the second rolling device;

step 5: curing of the LED package elements: in a vacuum condition, by means of heat curing and/or photocuring, curing the LED package elements in step 4 by using a curing apparatus E, to obtain cured LED package elements; and step 6: cutting of the LED package elements: removing the special-shaped microporous carrier sheet from the cured LED package elements in step 5, and cutting the cured LED package elements, to form finished LED package elements having slits for splitting the finished product into individual LED package elements.

It should be further noted that:

The present invention is applicable to production and processing of a photoelectric device or an electronic device of a structure similar to that of a flip chip LED. Any existing organic silicone resin having high light transmittance and desirable temperature resistance may be selected to be used in the process method of the present invention. In order to meet a temperature requirement of reflow soldering of a common LED package element in use and to resist aging caused by heat and light in long-term use, the present invention preferably uses methyl vinyl organic silicone resin. Existing quantum dot fluorophor and fluorescent powder can be both selected to be used in the process method of the present invention.

In a general case, mixed slurry used in the present invention does not need to contain an adhesive. When finished LED package elements are used in an extreme condition and adhesion between a photoconverter and an LED needs to be further enhanced, the mixed slurry used in the present invention may contain an adhesive.

Figure 3:
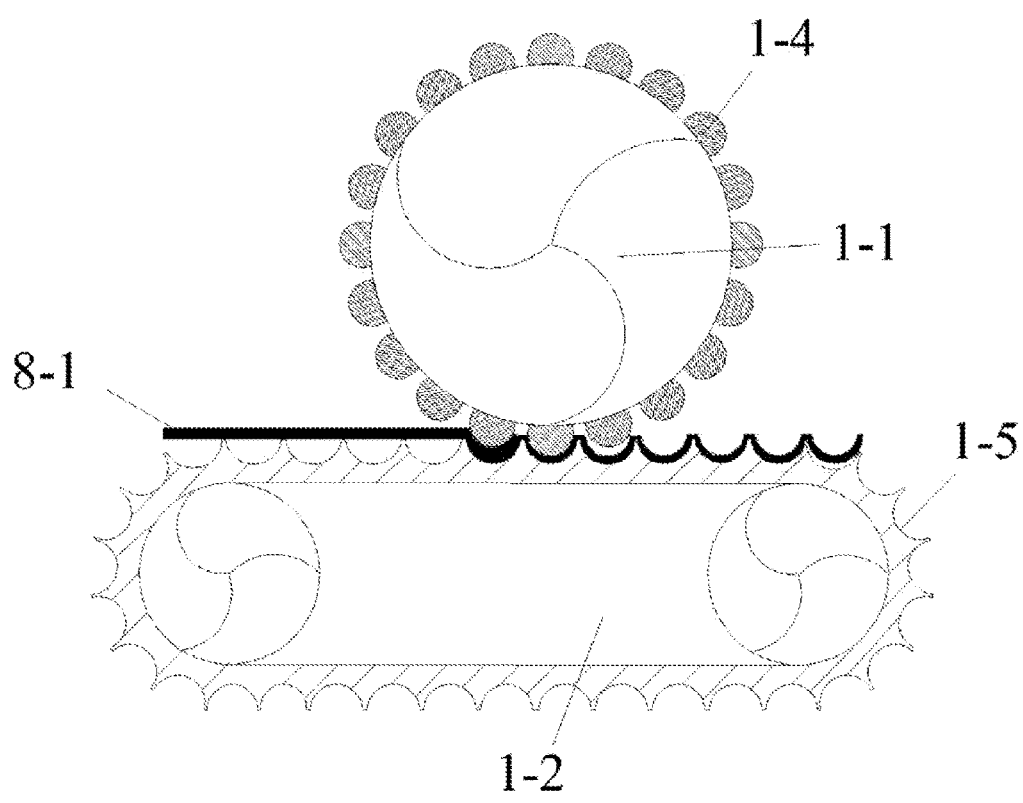
FIG. 3 is a schematic diagram of a stage of performing roll-shaping on a special-shaped microporous carrier sheet shown in FIG. 2 of the present invention.
Figure 7:
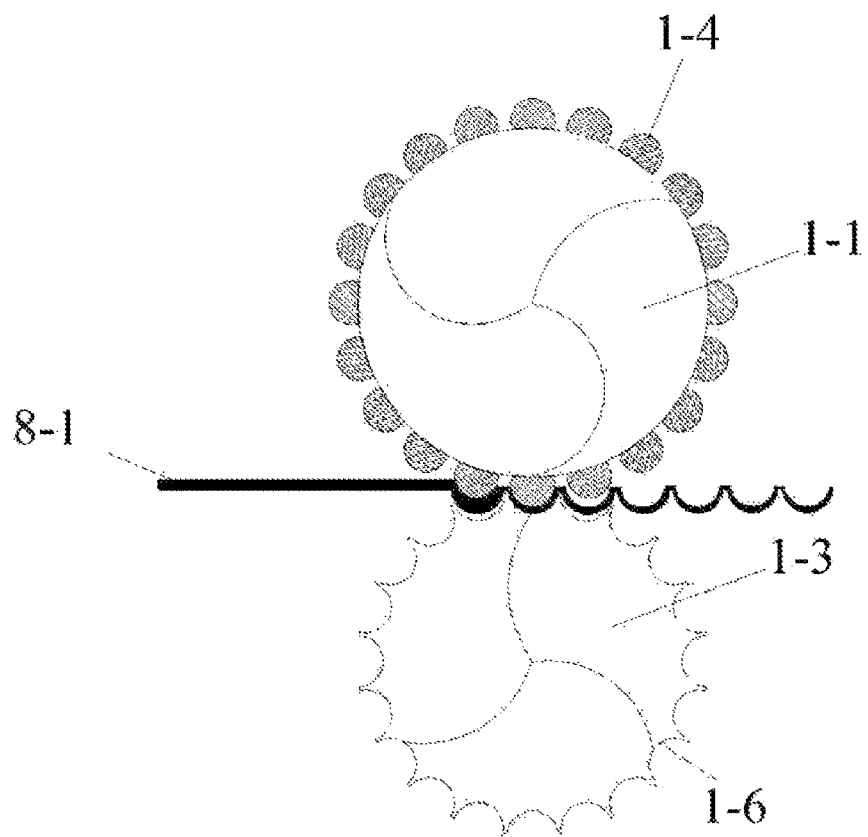
FIG. 7 is a schematic diagram of a stage of performing roll-shaping on a carrier sheet shown in FIG. 6 of the present invention.

Further preferred solutions of the process method for bond-packaging an LED using a refined photoconverter according to the present invention are as follows: The roll-shaping of a special-shaped microporous carrier sheet in step 1 refers to: performing roll-shaping on the carrier sheet by using a first single-wheeled roller with a protrusion array or a first planar conveyor with a protrusion array and a second single-wheeled roller with a recess array or a second planar conveyor with a recess array, where the first rolling device with a protrusion array is the first single-wheeled roller with a protrusion array or the first planar conveyor with a protrusion array, the second rolling device with a recess array is the second single-wheeled roller with a recess array or the second planar conveyor with a recess array, and at least one of the first rolling device and the second rolling device is a single-wheeled roller. Referring to FIG. 3 and FIG. 7, FIG. 3 shows a stage of performing roll-shaping on the special-shaped microporous carrier sheet by using the first single-wheeled roller with a protrusion array and the second planar conveyor with a recess array, and FIG. 7 shows a stage of performing roll-shaping on the special-shaped microporous carrier sheet by using the first single-wheeled roller with a protrusion array and the second single-wheeled roller with a recess array.

A material of the special-shaped microporous carrier sheet in step 1 is polyester, polyolefin, or polyether.

The roll-shaping in step 1 is performed at a temperature ranging from 50° C. to 150° C. Preferably, the temperature of the roll-shaping ranges from 80° C. to 120° C.

The shape of the recesses on the special-shaped carrier sheet with a recess array in step 1 is a cambered surface, a hemispheric surface, or a planar surface; the shape of the protrusions in the protrusion array is a cambered surface, a hemispheric surface, or a planar surface; and the shape of the recesses in the recess array matches the shape of the protrusions in the protrusion array.

The mixed slurry in step 2 further contains an adhesive.

The photoconversion material in step 2 is quantum dot fluorophor or fluorescent powder.

A material of the planar conveyor A in step 2 is carbon steel, stainless steel, aluminum alloy, copper alloy or heat-resistant resin.

The refining device in step 2 includes a light irradiator B and a negative pressure-suction and magnetic vibration device D that are disposed face-to-face and aligned with each other; the light irradiator B is disposed above the planar conveyor A; the negative pressure-suction and magnetic vibration device D is disposed below the planar conveyor A; and a suction and a magnetic vibration force that are produced by the negative pressure-suction and magnetic vibration device D, together with the light irradiation energy, act upon the special-shaped microporous carrier sheet loaded with the mixed slurry. A negative pressure value of the negative pressure-suction and magnetic vibration device is greater than or equal to 100 Pa, a magnetic field intensity value is greater than or equal to 1 mT, and a vibration frequency is greater than or equal to 20 Hz.

The refining device in step 2 is a tunnel-type curing device using techniques of programmed multi-temperature-zone heating and programmed multi-temperature-zone cooling, the temperature in the programmed multi-temperature-zone heating ranging from the room temperature to 50° C.-120° C., and the temperature in the programmed multi-tempera-ture-zone cooling ranging from 50° C.-120° C. to room temperature; continuous curing duration in each temperature zone is adjustable; and light irradiation duration ranges from 3 min to 60 min. Preferably, the temperature in the programmed multi-temperature-zone heating ranges from room temperature to 80° C.-100° C., and the temperature in the programmed multi-temperature-zone cooling ranges from 80° C.-100° C. to room temperature.

The refining device in step 2 uses a technique of constant-temperature light irradiation, the temperature of the constant-temperature light irradiation ranging from 50° C. to 120° C., and duration of the constant-temperature light irradiation ranging from 3 min to 60 min. Preferably, the temperature of the constant-temperature light irradiation ranges from 80° C. to 100° C.

The carrier sheet in step 3 is an extensible carrier sheet, and a material of the extensible carrier sheet is one of heat-resistant polyester, polydimethylsiloxane, or polyvinyl chloride.

Figure 5:
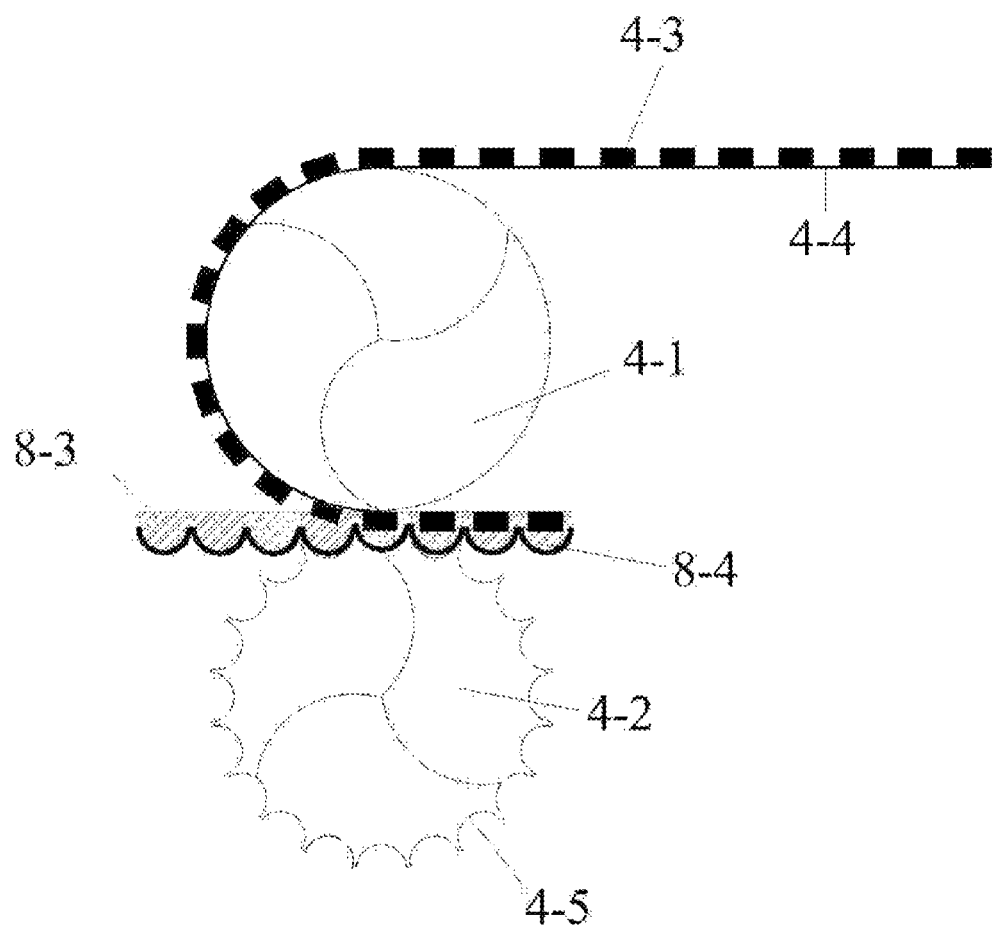
FIG. 5 is a schematic diagram of a stage of forming LED package elements by roll-bonding shown in FIG. 2 of the present invention.

The forming of LED package elements by roll-bonding in step 4 refers to: conveying the semi-cured photoconversion sheet to a fourth single-wheeled roller with a recess array or a fourth planar conveyor with a recess array, and then performing roll-bonding on the semi-cured photoconversion sheet and the flip chip LEDs in the flip chip LED array sheet arranged on a third single-wheeled roller with a smooth surface or a third planar conveyor with a smooth surface, the semi-cured photoconversion sheet and the flip chip LED array sheet facing each other and being aligned with each other, where the third rolling device is the third single-wheeled roller with a smooth surface or the third planar conveyor with a smooth surface, the fourth rolling device is the fourth single-wheeled roller with a recess array or the fourth planar conveyor with a recess array, and at least one of the third rolling device and the fourth rolling device is a single-wheeled roller. FIG. 5 shows a stage of performing roll-bonding on the semi-cured photoconversion sheet and the flip chip LEDs arranged on the third single-wheeled roller with a smooth surface by using a fourth single-wheeled roller with a recess array, the semi-cured photoconversion sheet and the flip chip LED array sheet facing each other and being aligned with each other.

The roll-bonding temperature in the forming of LED package elements by roll-bonding in step 4 ranges from 50° C. to 120° C. The optimal roll-bonding temperature for forming ranges from 80° C. to 100° C.

The curing temperature in the heat-curing manner in step 5 ranges from 140° C. to 180° C., and curing duration is greater than or equal to 1 h. The optimal curing temperature ranges from 150° C. to 160° C., and the optimal curing duration is 2 h.

The photocuring manner in step 5 is curing with an active energy ray.

The cutting of the LED package elements in step 6 refers to: performing roll-cutting on the cured LED package elements by using a fifth rolling component with an arrayed cutter and a sixth rolling component with a smooth surface that are disposed face-to-face and aligned with each other, to obtain finished LED package elements having slits for splitting the finished product into individual LED package elements. The width of the slit in step 6 is no more than 20 and the optimal width of the slit is 15 μm.

The fifth rolling component 5 with an arrayed cutter is a fifth single-wheeled roller 5 with an arrayed cutter or a fifth planar conveyor with an arrayed cutter, the sixth rolling component with a smooth surface is a sixth single-wheeled roller with a smooth surface or a sixth planar conveyor with a smooth surface, and at least one of the fifth rolling component with an arrayed cutter and the sixth rolling component with a smooth surface is a single-wheeled roller. The arrayed cutter in the fifth rolling component is a cutter having an array of rectangular grids. Dimensions of each rectangular grid are the same as those of an individual finished LED package element; and a gap between rollers or between a roller and a plane does not exceed the thickness of the carrier film in the flip chip LED array sheet.

It should be noted that, FIG. 2 shows a process flow layout of the present invention in which roll-shaping is performed on the special-shaped microporous carrier sheet by using the first single-wheeled roller with a protrusion array and the second planar conveyor with a recess array, and roll-bonding is performed on the semi-cured photoconversion sheet and the flip chip LEDs arranged on the third single-wheeled roller with a smooth surface by using the fourth single-wheeled roller with a recess array, the semi-cured photoconversion sheet and the flip chip LED array sheet facing each other and being aligned with each other. FIG. 6 shows a process flow layout of the present invention in which roll-shaping is performed on the special-shaped microporous carrier sheet by using the first single-wheeled roller with a protrusion array and the second single-wheeled roller with a recess array, and roll-bonding is performed on the semi-cured photoconversion sheet and the flip chip LEDs arranged on the third single-wheeled roller with a smooth surface by using the fourth single-wheeled roller with a recess array, the semi-cured photoconversion sheet and the flip chip LED array sheet facing each other and being aligned with each other.

Figure 8A:
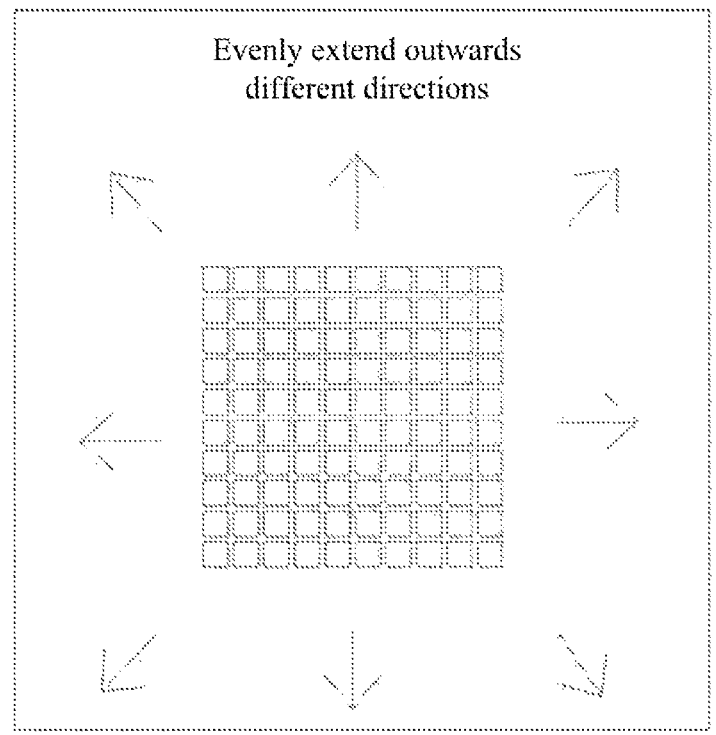
FIG. 8A is a schematic planar structural diagram of finished LED package elements manufactured according to the present invention.
Figure 8B:
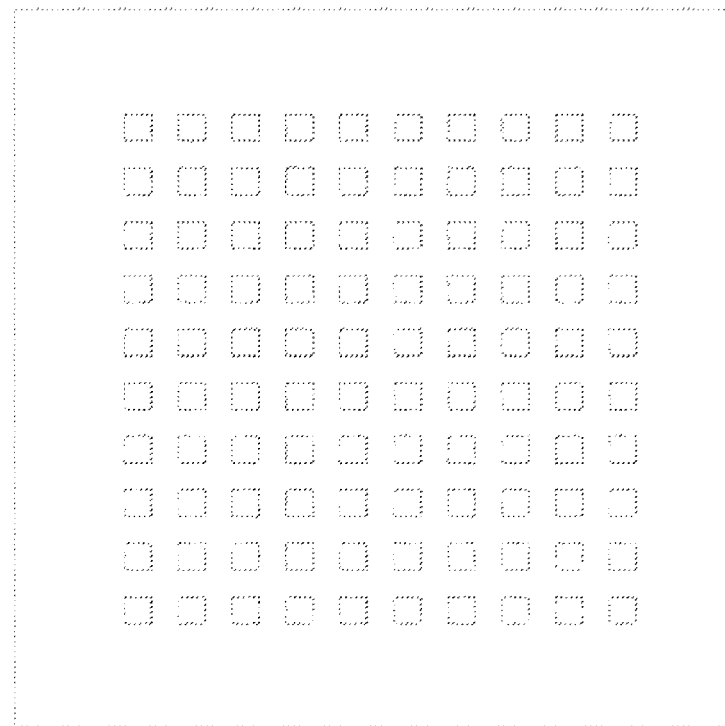
FIG. 8B is a schematic planar structural diagram of finished individual LED package elements obtained by extending according to the present invention.

As required, an extender may be used to extend the extensible carrier sheet of the finished LED package elements with slits in step 6, such that the finished LED package elements with slits are split along the slits upon being extended, to obtain finished individual LED package elements, as shown in FIG. 8A and FIG. 8B.

Figures 1, 2, 9A:
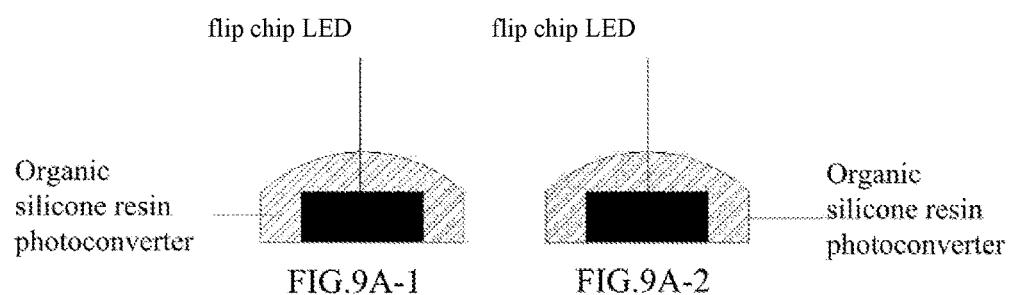
FIG. 9A shows cambered surface-shaped LED package element manufactured according to the present invention, where
Figures 3, 4, 9A:
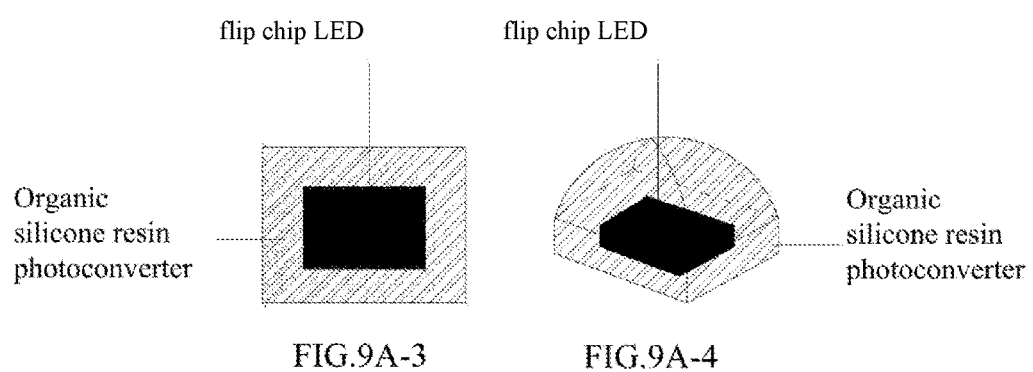

Each finished individual LED package element manufactured according to the present invention may be cambered surface-shaped LED package element, a hemispheric surface-shaped LED package element, or a planar surface-shaped LED package element, as shown in FIGS. 9A, 9B and 9C.

The process method for bond-packaging an LED using a refined photoconverter provided by the present invention is widely applicable to a packaging process of bonding an organic resin photoconverter to LED clip chips of different power.

Embodiment 2

The present invention provides a refining equipment system applied to the process method for bond-packaging an LED using a refined photoconverter, which includes: a special-shaped microporous carrier sheet roll-shaping apparatus used for performing roll-shaping on a special-shaped microporous carrier sheet; a semi-cured photoconversion sheet refining apparatus used for forming a semi-cured photoconversion film on the shaped special-shaped microporous carrier sheet; and a roll-bonding apparatus used for forming LED package elements by roll-bonding, where the special-shaped microporous carrier sheet roll-shaping apparatus, the semi-cured photoconversion sheet refining apparatus, and the roll-bonding apparatus are sequentially arranged to form cooperatively linked process equipment.

The special-shaped microporous carrier sheet roll-shaping apparatus includes a first rolling device with a protrusion array and a second rolling device with a recess array that are disposed face-to-face and aligned with each other, and the roll-bonding apparatus includes a fourth rolling device with a recess array and a third rolling device with a smooth surface that are disposed face-to-face and aligned with each other.

The semi-cured photoconversion sheet refining apparatus includes a doser for mixed slurry at least containing a photoconversion material and organic silicone resin, a planar conveyor A with a recess array disposed right below the doser, and a refining device for refining the semi-cured photoconversion sheet.

Specific implementations of the refining equipment system and a follow-on equipment system applied to the process method for bond-packaging an LED using a refined photoconverter provided by the present invention are further disclosed as follows:

In the refining equipment system, the first rolling device with a protrusion array is a first single-wheeled roller with a protrusion array or a first planar conveyor with a protrusion array, the second rolling device with a recess array is a second single-wheeled roller with a recess array or a second planar conveyor with a recess array, and at least one of the first rolling device and the second rolling device is a single-wheeled roller. As shown in FIG. 3 and FIG. 7, FIG. 3 shows a structure of the roll-shaping apparatus in which the first rolling device is the first single-wheeled roller with a protrusion array and the second rolling device is the second planar conveyor with a recess array; and FIG. 7 shows a structure of the roll-shaping apparatus in which the first rolling device is the first single-wheeled roller with a protrusion array and the second rolling device is the second single-wheeled roller with a recess array.

In the refining equipment system, the third rolling device with a smooth surface is a third single-wheeled roller with a smooth surface or a third planar conveyor with a smooth surface, the fourth rolling device with a recess array is a fourth single-wheeled roller with a recess array or a fourth planar conveyor with a recess array, and at least one of the third rolling device and the fourth rolling device is a single-wheeled roller. FIG. 5 shows a structure of the roll-bonding apparatus in which the third rolling device is the third single-wheeled roller with a smooth surface and the fourth rolling device is the fourth single-wheeled roller with a recess array.

The shape and dimensions of each recess in the planar conveyor A with a recess array are the same as those of each recess in the second rolling device with a recess array. The shape and dimensions of each recess in the fourth rolling device with a recess array are the same as those of each recess in the second rolling device with a recess array.

The shape of a protrusion in the protrusion array is a cambered surface, a hemispheric surface, or a planar surface. The shape and dimensions of the protrusion in the protrusion array match those of the recess in the recess array.

The special-shaped microporous carrier sheet roll-shaping apparatus is provided with a displacement adjusting device for adjusting a gap between rollers or between a roller and a planar conveyor. The roll-bonding apparatus is provided with a displacement adjusting device for adjusting a gap between rollers or between a roller and a planar conveyor.

A radial run-out distance of the single-wheeled roller in the special-shaped microporous carrier sheet roll-shaping apparatus is less than or equal to 2 µm. A radial run-out distance of the single-wheeled roller in the roll-bonding apparatus is less than or equal to 2 µm.

The doser includes a vacuum stirring component and at least one discharge port which is arranged in a row. A first solution of the refining device includes a light irradiator B and a negative pressure suction device C, and further includes a temperature control component and a passage of the planar conveyor A. The light irradiator B and the negative pressure suction device C are disposed face-to-face and aligned with each other, the light irradiator B is disposed above the planar conveyor A, the negative pressure suction device C is disposed below the planar conveyor A, and a suction produced by the negative pressure suction device C, together with the light irradiation energy, acts upon the special-shaped microporous carrier sheet loaded with the mixed slurry. A negative pressure value of the negative pressure suction device C is greater than or equal to 100 Pa.

A second solution of the refining device includes a light irradiator B and a negative pressure-suction and magnetic vibration device D that are disposed face-to-face and aligned with each other, where the light irradiator B is disposed above the planar conveyor A, and the negative pressure-suction and magnetic vibration device D is disposed below the planar conveyor A. A suction and a magnetic vibration force that are produced by the negative pressure-suction and magnetic vibration device D, together with the light irradiation energy, act upon the special-shaped microporous carrier sheet loaded with the mixed slurry. A negative pressure value of the negative pressure-suction and magnetic vibration device D is greater than or equal to 100 Pa, a magnetic field intensity value is greater than or equal to 1 mT, and a vibration frequency is greater than or equal to 20 Hz.

The follow-on equipment system further includes a curing apparatus E for manufacturing cured LED package elements, where the curing apparatus E is process equipment located at a rear end of the roll-bonding apparatus. The curing apparatus E is a tunnel-type temperature control apparatus or a tunnel-type illuminating apparatus. The tunnel-type temperature control apparatus includes a heating component, a temperature control component and a passage of the planar conveyor A. The tunnel-type illuminating apparatus includes an illuminating component, an illumination intensity control component and a passage of the planar conveyor A.

The follow-on equipment system further includes a cutting apparatus for cutting the cured LED package elements, to slits along which the cured LED package elements can be separated into individual LED package elements, where the cutting apparatus is process equipment disposed at a rear end of the curing apparatus E.

The cutting apparatus includes a fifth rolling component with an arrayed cutter and a sixth rolling component with a smooth surface that are disposed face-to-face and aligned with each other. The fifth rolling component with an arrayed cutter is a fifth single-wheeled roller with an arrayed cutter or a fifth planar conveyor with an arrayed cutter. The sixth rolling component with a smooth surface is a sixth single-wheeled roller with a smooth surface or a sixth planar conveyor with a smooth surface. At least one of the fifth rolling component with an arrayed cutter and the sixth rolling component with a smooth surface is a single-wheeled roller. The arrayed cutter on the fifth rolling component is a cutter having an array of rectangular grids. Dimensions of each rectangular grid is the same as those of a finished individual LED package element. The cutting apparatus is provided with a displacement adjusting device for adjusting a gap between rollers or between a roller and a planar conveyor.

In the refining equipment system and the follow-on equipment system, the special-shaped microporous carrier sheet roll-shaping apparatus, the semi-cured photoconversion sheet refining apparatus, the roll-bonding apparatus, the curing apparatus E, and the cutting apparatus are cooperatively linked in sequence, to form flow-type continuous process equipment.

It should be noted that, FIG. 2 shows flow-type continuous process equipment matching the present invention, in which the first rolling device is the first single-wheeled roller with a protrusion array, the second rolling device is the second planar conveyor with a recess array, the third rolling device is the third single-wheeled roller with a smooth surface, and the fourth rolling device is the fourth single-wheeled roller with a recess array. FIG. 6 shows flow-type continuous process equipment matching the present invention, in which the first rolling device is the first single-wheeled roller with a protrusion array, the second rolling device is the second single-wheeled roller with a recess array, the third rolling device is the third single-wheeled roller with a smooth surface, and the fourth rolling device is the fourth single-wheeled roller with a recess array.

Any description not involved in the specific implementations of the present invention belongs to well-known technologies in the art and can be implemented with reference to the well-known technologies.

The present invention gains a satisfactory trial result after repeated test and verification. The foregoing specific implementations and embodiments give a specific support for a technical idea and a process method for bond-packaging an LED using a refined photoconverter according to the present invention, and are not intended to limit the protection scope of the present invention. Any equivalent changes or modifications made on the basis of the technical solutions according to the technical idea proposed in the present invention still fall within the protection scope of the technical solutions of the present invention.

What is claimed is:

1. A process method for bond-packaging an LED using a refined photoconverter, comprising the following continuous process flow: roll-shaping of a special-shaped microporous carrier sheet, refining of a semi-cured photoconversion sheet, preparation of a flip chip LED array sheet, forming of LED package elements by roll-bonding, curing of the LED package elements, and cutting of the LED package elements, comprising the following steps:

step 1: roll-shaping of a special-shaped microporous carrier sheet: performing roll-shaping on a microporous carrier sheet by using a first rolling device with a protrusion array and a second rolling device with a recess array that are disposed face-to-face and aligned with each other, to obtain a special-shaped microporous carrier sheet with a recess array, wherein, a micropore diameter of the microporous carrier sheet being not greater than 10 μm;

step 2: refining of a semi-cured photoconversion sheet: conveying the special-shaped microporous carrier sheet in step 1 to a planar conveyor A with a recess array to continuously convey the sheet forward, and allocating mixed slurry containing a photoconversion material and an organic silicone resin to the special-shaped microporous carrier sheet by using a doser, to form a mixed slurry layer with a fixed thickness; then continuously conveying the sheet forward to enter a refining device for negative pressure suction and light irradiation, to obtain a refined semi-cured photoconversion sheet, wherein the refining device comprises a light irradiator B and a negative pressure suction device C that are disposed face-to-face and aligned with each other, the light irradiator B is disposed above the planar conveyor A, the negative pressure suction device C is disposed below the planar conveyor A, and a suction produced by the negative pressure suction device C, together with the light irradiation energy, acts upon the special-shaped microporous carrier sheet loaded with the mixed slurry; and the shape and dimensions of each recess in the recess array in the planar conveyor A are the same as those of each recess in the second rolling device with a recess array, i.e., recesses on the special-shaped microporous carrier sheet and recesses on the planar conveyor A fit snugly together;

step 3: preparation of a flip chip LED array sheet: acquiring a flip chip LED array sheet, wherein flip chip LEDs in the flip chip LED array sheet are arranged in an array on the carrier sheet, the flip chip LED referring to an individual flip chip LED or a flip chip LED assembly, and the flip chip LED assembly being composed of two or more flip chip LEDs;

step 4: forming of LED package elements by roll-bonding: in a vacuum heating condition, conveying the semi-cured photoconversion sheet in step 2 to a fourth rolling device with a recess array, and then performing roll-bonding on the semi-cured photoconversion sheet and the flip chip LEDs in the flip chip LED array sheet arranged on a third rolling device, the semi-cured photoconversion sheet and the flip chip LED array sheet facing each other and being aligned with each other, to obtain LED package elements, wherein the shape and dimensions of each recess in the recess array in the fourth rolling device are the same as those of each recess in the recess array in the second rolling device;

step 5: curing of the LED package elements: in a vacuum condition, by means of heat curing and/or photocuring, curing the LED package elements in step 4 by using a curing apparatus E, to obtain cured LED package elements; and step 6: cutting of the LED package elements: removing the special-shaped microporous carrier sheet from the cured LED package elements in step 5, and cutting the cured LED package elements, to form finished LED package elements having slits for splitting the finished product into individual LED package elements.

2. The process method for bond-packaging an LED using a refined photoconverter according to claim 1, wherein the roll-shaping of a special-shaped microporous carrier sheet in step 1 refers to: performing roll-shaping on the special-shaped microporous carrier sheet by using a first single-wheeled roller with a protrusion array or a first planar conveyor with a protrusion array and a second single-wheeled roller with a recess array or a second planar conveyor with a recess array, wherein the first rolling device with a protrusion array is the first single-wheeled roller with a protrusion array or the first planar conveyor with a protrusion array, and the second rolling device with a recess array is the second single-wheeled roller with a recess array or the second planar conveyor with a recess array, and at least one of the first rolling device and the second rolling device is a single-wheeled roller.

3. The process method for bond-packaging an LED using a refined photoconverter according to claim 1, wherein the forming of LED package elements by roll-bonding in step 4 refers to: conveying the semi-cured photoconversion sheet to a fourth single-wheeled roller with a recess array or a fourth planar conveyor with a recess array, and then performing roll-bonding on the semi-cured photoconversion sheet and the flip chip LEDs in the flip chip LED array sheet arranged on a third single-wheeled roller with a smooth surface or a third planar conveyor with a smooth surface, the semi-cured photoconversion sheet and the flip chip LED array sheet facing each other and being aligned with each other, wherein the third rolling device is the third single-wheeled roller with a smooth surface or the third planar conveyor with a smooth surface, the fourth rolling device is the fourth single-wheeled roller with a recess array or the fourth planar conveyor with a recess array, and at least one of the third rolling device and the fourth rolling device is a single-wheeled roller.

4. The process method for bond-packaging an LED using a refined photoconverter according to claim 3, wherein the roll-bonding temperature in the forming of LED package elements by roll-bonding in step 4 ranges from 50° C. to 120° C.

5. The process method for bond-packaging an LED using a refined photoconverter according to claim 1, wherein a material of the special-shaped microporous carrier sheet in step 1 is polyester, polyolefin, or polyether.

6. The process method for bond-packaging an LED using a refined photoconverter according to claim 5, wherein the roll-shaping in step 1 is performed at a temperature ranging from 50° C. to 150° C.

7. The process method for bond-packaging an LED using a refined photoconverter according to claim 1, wherein the shape of the recesses on the special-shaped microporous carrier sheet with a recess array in step 1 is a cambered surface, a hemispheric surface, or a planar surface; the shape of the protrusions in the protrusion array is a cambered surface, a hemispheric surface, or a planar surface; and the shape of the recesses in the recess array matches the shape of the protrusions in the protrusion array.

8. The process method for bond-packaging an LED using a refined photoconverter according to claim 1, wherein the mixed slurry in step 2 further contains an adhesive.

9. The process method for bond-packaging an LED using a refined photoconverter according to claim 1, wherein a second solution of the refining device in step 2 comprises a light irradiator B and a negative pressure-suction and magnetic vibration device D that are disposed face-to-face and aligned with each other; the light irradiator B is disposed above the planar conveyor A; the negative pressure-suction and magnetic vibration device D is disposed below the planar conveyor A; and a suction and a magnetic vibration force that are produced by the negative pressure-suction and magnetic vibration device D, together with the light irradiation energy, act upon the special-shaped microporous carrier sheet loaded with the mixed slurry.

10. The process method for bond-packaging an LED using a refined photoconverter according to claim 1, wherein the refining device in step 2 is a tunnel-type curing device using techniques of programmed multi-temperature-zone heating and programmed multi-temperature-zone cooling, the temperature in the programmed multi-temperature-zone heating ranging from room temperature to 50° C.-120° C., and the temperature in the programmed multi-temperature-zone cooling ranging from 50° C.-120° C. to room temperature; continuous curing duration in each temperature zone is adjustable; and light irradiation duration ranges from 3 min to 60 min; or the refining device in step 2 uses a technique of constant-temperature light irradiation, the temperature of the constant-temperature light irradiation ranging from 50°

C. to 120° C., and duration of the constant-temperature light irradiation ranging from 3 min to 60 min.

11. The process method for bond-packaging an LED using a refined photoconverter according to claim 1, wherein the photoconversion material in step 2 is quantum dot fluorophor or fluorescent powder.

12. The process method for bond-packaging an LED using a refined photoconverter according to claim 1, wherein the curing temperature of the heat curing in step 5 ranges from 140° C. to 180° C., and the curing duration is greater than or equal to 1 h.

13. The process method for bond-packaging an LED using a refined photoconverter according to claim 1, wherein the cutting of the cured LED package elements in step 6 refers to:
   performing roll-cutting on the cured LED package elements by using a fifth rolling component with an arrayed cutter and a sixth rolling component with a smooth surface that are disposed face-to-face and aligned with each other, wherein
   the fifth rolling component with an arrayed cutter is a fifth single-wheeled roller with an arrayed cutter or a fifth planar conveyor with an arrayed cutter, the sixth rolling component with a smooth surface is a sixth single-wheeled roller with a smooth surface or a sixth planar conveyor with a smooth surface, and at least one of the fifth rolling component with an arrayed cutter and the sixth rolling component with a smooth surface is a single-wheeled roller;
   the arrayed cutter in the fifth rolling component is a cutter having an array of rectangular grids, dimensions of each rectangular grid being the same as those of an individual finished LED package element; and
   a gap between rollers or between a roller and a plane does not exceed the thickness of the carrier sheet in the flip chip LED array sheet.

14. The process method for bond-packaging an LED using a refined photoconverter according to claim 1, wherein the width of the slit in step 6 is no more than 20 μm.

15. The process method for bond-packaging an LED using a refined photoconverter according to claim 1, wherein the carrier sheet in step 3 is an extensible carrier sheet, and a material of the extensible carrier sheet is one of heat-resistant polyester, polydimethylsiloxane, or polyvinyl chloride.

16. The process method for bond-packaging an LED using a refined photoconverter according to claim 1, further comprising extending the extensible carrier sheet of the finished LED package elements with slits in step 6 by using an extender, such that the finished LED package elements with slits are split along the slits upon being extended, to obtain finished individual LED package elements.

17. A refining equipment system applied to the process method for bond-packaging an LED using a refined photoconverter according to claim 1, comprising: a special-shaped microporous carrier sheet roll-shaping apparatus used for performing roll-shaping on a special-shaped microporous carrier sheet; a semi-cured photoconversion sheet refining apparatus used for forming a semi-cured photoconversion sheet; and a roll-bonding apparatus used for forming LED package elements by roll-bonding, wherein the special-shaped microporous carrier sheet roll-shaping apparatus, the semi-cured photoconversion sheet refining apparatus, and the roll-bonding apparatus are sequentially arranged to form cooperatively linked process equipment, wherein
   the special-shaped microporous carrier sheet roll-shaping apparatus comprises a first rolling device with a protrusion array and a second rolling device with a recess array that are disposed face-to-face and aligned with each other, and the roll-bonding apparatus comprises a fourth rolling device with a recess array and a third rolling device with a smooth surface that are disposed face-to-face and aligned with each other; and
   the semi-cured photoconversion sheet refining apparatus comprises a doser for mixed slurry at least containing a photoconversion material and an organic silicone resin, a planar conveyor A with a recess array disposed right below the doser, and a refining device for forming the semi-cured photoconversion sheet.

18. The refining equipment system applied to the process method for bond-packaging an LED using a refined photoconverter according to claim 17, wherein the refining device comprises a light irradiator B and a negative pressure suction device C that are disposed face-to-face and aligned with each other, the light irradiator B is disposed above the planar conveyor A, the negative pressure suction device C is disposed below the planar conveyor A, and a suction produced by the negative pressure suction device C, together with the light irradiation energy, acts upon the special-shaped microporous carrier sheet loaded with the mixed slurry.

19. The refining equipment system applied to the process method for bond-packaging an LED using a refined photoconverter according to claim 17, wherein the refining device comprises a light irradiator B and a negative pressure-suction and magnetic vibration device D that are disposed face-to-face and aligned with each other; the light irradiator B is disposed above the planar conveyor A; the negative pressure-suction and magnetic vibration device D is disposed below the planar conveyor A; and a suction and a magnetic vibration force that are produced by the negative pressure-suction and magnetic vibration device D, together with the light irradiation energy, act upon the special-shaped microporous carrier sheet loaded with the mixed slurry.

* * * * *